United States Patent [19]
Komuro

[11] Patent Number: 5,652,154
[45] Date of Patent: Jul. 29, 1997

[54] METHOD FOR MANUFACTURING BIMOS DEVICE

[75] Inventor: Toshio Komuro, Tokyo, Japan

[73] Assignee: NEC Corporation, Japan

[21] Appl. No.: 679,379

[22] Filed: Jul. 8, 1996

Related U.S. Application Data

[62] Division of Ser. No. 625,904, Apr. 1, 1996.

[30] Foreign Application Priority Data

Mar. 30, 1995 [JP] Japan ............................. 7-095859

[51] Int. Cl.$^6$ ............................................ H01L 21/265
[52] U.S. Cl. ...................... 437/31; 437/44; 437/59; 437/162; 148/DIG. 9
[58] Field of Search .......................... 437/31, 41, 44, 437/59, 162; 148/DIG. 9

[56] References Cited

U.S. PATENT DOCUMENTS

| | | | |
|---|---|---|---|
| 4,927,776 | 5/1990 | Soejima | 437/59 |
| 4,960,726 | 10/1990 | Lechaton et al. | 437/59 |
| 4,965,220 | 10/1990 | Iwasaki | 437/59 |
| 5,059,549 | 10/1991 | Furuhata | 437/59 |

FOREIGN PATENT DOCUMENTS

| | | |
|---|---|---|
| 0304765 | 12/1989 | Japan ............................. 437/59 |
| 2237146 | 9/1990 | Japan . |

*Primary Examiner*—John Niebling
*Assistant Examiner*—Long Pham
*Attorney, Agent, or Firm*—Hayes, Soloway, Hennessey, Grossman & Hage, P.C.

[57] ABSTRACT

In a method for manufacturing a "BiCMOS" semiconductor integrated circuit, a gate oxide film 110 and a polysilicon film are grown on a semiconductor substrate, and after phosphorus is doped, the polysilicon film is patterned to form gate electrodes 112a and 112b and an emitter electrode 112c. A heat treatment is performed to form an emitter diffused region 113. Phosphorus and boron are selectively implanted with a low impurity concentration, respectively, to form a LDD N$^-$ region 114 and a LDD P$^-$ region 115. Thereafter, a side wall 116 is formed, and boron is implanted into areas B and C so as to form P$^+$ source/drain regions 117 and a graft base region 18, respectively. Phosphorus is implanted to form N$^+$ source/drain regions 119.

2 Claims, 16 Drawing Sheets

METHOD FOR MANUFACTURING BIMOS DEVICE

This is a divisional of copending application Ser. No. 08/625,904 filed on Apr. 1, 1996.

BACKGROUND OF THE INVENTION

1. Field of the Invention

The present invention relates to a semiconductor integrated circuit and a method for manufacturing the same, and more specifically to a semiconductor integrated circuit called a "BiMOS" or "BiCMOS" in which bipolar transistors and MOS transistors are formed on the same single semiconductor substrate, and a method for manufacturing the same.

2. Description of Related Art

One problem in microminiaturizing MOS transistors is the hot carrier effect. This is caused because when channel length is shortened, the electric field in proximity of the drain becomes strong. Namely, electrons accelerated by the high electric field collide against the silicon crystal to generate electron-hole pairs, so that the electrons thus generated are trapped in gate oxide film, with the result that the film quality of the gate oxide film is deteriorated. In order to suppress this hot carrier effect, it is known that it is effective to adopt a so called LDD (lightly doped drain) structure in which a low impurity concentration region is provided at an end of the drain. At present, this structure is widely used.

On the other hand, in order to realize a high speed operation and a high performance in the MOS semiconductor integrated circuit, the BiMOS or BiCMOS technology has been adopted in which bipolar transistors and MOS transistors are formed mixedly on the same single semiconductor substrate. By adopting the BiMOS technology, it is possible to obtain together high integration density of the MOS integrated circuit and high speed operation of the bipolar transistors. Furthermore, by using BiCMOS technology, it is possible to realize a semiconductor integrated circuit which simultaneously satisfies the need for low consumed current of the CMOS circuit and high speed operation of the bipolar transistors.

One example of the prior art technology for forming MOS transistors of the LDD structure and bipolar transistors on the same single semiconductor substrate, is disclosed by Japanese Patent Application Laid-open Publication No. JP-A-02-237146. Now, this prior art process will be described with reference to FIGS. 1 to 3.

FIG. 1 illustrates a substrate in a condition just before a gate electrode of MOS transistors is formed in the process of manufacturing the BiCMOS semiconductor integrated circuit. In this example, an nMOS transistor is formed in an area A, and a pMOS transistor is formed in an area B. A bipolar transistor is formed in an area C. An area D is a device isolation part for isolating the pMOS transistor and the bipolar transistor from each other.

First, N-type buried layers 302 are formed by ion-implanting arsenic to a P-type silicon substrate 301 in the areas B and C, and a P-type buried layer 303 is formed by ion-implanting boron to the P-type silicon substrate 301 in the area A and D. Then, an N-type epitaxial layer 304 is grown on the whole surface of the substrate.

By ion-implanting boron to the N-type epitaxial layer 304 in the areas A and D, P-type wells 305 are formed, and by ion-implanting phosphorus to the N-type epitaxial layer 304 in area B, an N-type well 306 is formed. Furthermore, a field oxide film 307 is formed on a surface of the substrate, and then, after an ion implantation for controlling the threshold $V_T$ and an ion implantation for forming an intrinsic base region 309 for the bipolar transistor are carried out, a gate oxide film 310 is formed.

Thereafter, as shown in FIG. 2, a polysilicon is deposited as a gate electrode material, and selectively etched to form gate electrodes. Here, gate electrodes 312a and 312b are formed in areas A and B, but in area C, a polysilicon film 312c is left above the intrinsic base region 309. Then, by ion-implanting phosphorus at a low concentration in area A, LDD $N^-$ regions 314 are formed, and by ion-implanting boron at a low concentration in the area B, LDD $P^-$ regions 315 are formed. Furthermore, an oxide silicon film is grown on whole surface, and then, an isotropic etching is carried out to form side walls 316.

Thereafter, the gate oxide film 310 and the polysilicon film 312c remaining above the intrinsic base region 309 in area C are selectively removed. Then, a mask is formed of a photo resist, and by ion-implanting arsenic in areas A and C, $N^+$ source/drain regions 319 of the nMOS transistor and an emitter diffused region 313 are formed as shown in FIG. 3. Similarly, after a photo resist mask is formed, by ion-implanting boron fluoride in areas B and C, $P^+$ source/drain regions 317 of the pMOS transistor and an graft base region 318 are formed as shown in FIG. 3. Finally, an interlayer insulator film 320 is deposited and planarized, and then, contact holes are formed and electrode wirings 321 are formed of aluminum. Thus, the BiCMOS semiconductor device having the sectional structure shown in FIG. 3 is obtained.

In the above mentioned manufacturing process, when the anisotropic etching for forming the side wall spacers is carried out, area C of the bipolar transistor is covered with the gate oxide film 310 and the polysilicon film 312c. Therefore, an area in which an emitter-base junction is formed in future, is protected from damage resulting from the anisotropic etching.

In generally, when the emitter-base junction of the bipolar transistor is damaged, recombination centers generated by the damage will increase recombination current in the forward direction of the bipolar transistor and lower an emitter injection coefficient, with the result that the current amplification factor ($h_{FE}$) in the low current region drops. Therefore, the above mentioned prior art manufacturing process can produce a bipolar transistor having excellent characteristics.

There is another prior art manufacturing process of forming the graft base and the emitter diffused region by utilizing the polysilicon electrode. Now, the second prior art manufacturing process will be described with reference to FIGS. 4 to 6. In FIGS. 4 to 6, elements corresponding to those shown in FIGS. 1 to 3 are given the Reference Numerals having the same two least significant digits as those of Reference Numerals given to the corresponding ones shown in FIGS. 1 to 3, and explanation thereof will be omitted.

As shown in FIG. 4, after a intrinsic base region 409 is formed by ion-implanting boron into a base region, a silicon oxide film 427 is formed to previously cover a portion in which an emitter diffused region will be formed in a later manufacturing step, and then, a polysilicon for forming the base electrode is grown, and boron fluoride is ion-implanted so as to form a graft base region 418. Thereafter, the polysilicon is patterned to form a base electrode 428, and then, an interlayer insulator film 429 is grown.

Then, as shown in FIG. 5, the interlayer insulator film in areas A and B is selectively etched to the substrate surface, and a gate oxide film 410 and a gate electrode polysilicon are grown, and the polysilicon is patterned to form gate electrodes 412a and 412b. Furthermore, in like manner to the first prior art manufacturing process, phosphorus is ion-implanted in area A so as to form LDD N⁻ region 419, and boron is ion-implanted in area B so as to form LDD P⁻ region 415.

Thereafter, an oxide film for forming a side wall spacer for the MOS transistor is grown, and an anisotropic etching is performed so as to form a side wall 416. Furthermore, a selective ion-implantation is performed in area A and in area B, respectively, so as to form N⁺ source/drain regions 419 and P⁺ source/drain regions 417, respectively.

Thereafter, as shown in FIG. 6, after an interlayer insulator film 422 is grown, the interlayer insulator film 422 and the base electrode 428 are selectively etched to form an emitter opening. Furthermore, with a well-known self-alignment contact forming technology, an emitter region is formed. Namely, after the emitter opening is formed, for example, a silicon oxide film is formed, and then, an anisotropic etching is performed so as to form a side wall 425 within the emitter opening. Furthermore, an emitter electrode forming polysilicon is grown, and an emitter diffused region 412 is formed by ion-implanting arsenic. Thereafter, the polysilicon is patterned to form an emitter electrode 426. Finally, an interlayer insulating film 420 is grown and a heat treatment is carried out to planarize the surface. Necessary contact holes are formed, and electrode wiring 421 formed of aluminum is deposited. Thus, the BiCMOS semiconductor device having the sectional structure shown in FIG. 3 is obtained.

In this second prior art manufacturing process, since the emitter region is formed through the emitter electrode forming polysilicon, differently from the first prior art manufacturing process, it is possible to form the emitter-base junction shallowly, near to the surface of the substrate. Accordingly, it is possible to form a bipolar transistor having even more excellent performance.

However, in the first prior art manufacturing process, before the bipolar transistor is formed, the polysilicon film covered on the intrinsic base region has to be removed by the selective etching after forming a photo resist mask. Therefore, the manufacturing process is complicated, and the manufacturing cost is high.

In the second prior art manufacturing process, on the other hand, the process required for forming the MOS transistor and the process required for forming the bipolar transistor exist independently of each other. Therefore, the manufacturing process is complicated similarly to the first prior art manufacturing process, and the manufacturing cost is high.

SUMMARY OF THE INVENTION

Accordingly, it is an object of the present invention to provide a semiconductor integrated circuit and a method for manufacturing the same, which have overcome the above mentioned defects of the conventional ones.

Another object of the present invention is to provide a "BiMOS" or "BiCMOS" semiconductor integrated circuit which can be manufactured with a reduced number of manufacturing steps and therefore with a reduced manufacturing cost, and a method for manufacturing the same, which is capable of manufacturing the "BiMOS" or "BiCMOS" semiconductor integrated circuit with a reduced number of manufacturing steps and therefore with a reduced manufacturing cost.

The above and other objects of the present invention are achieved in accordance with the present invention by a semiconductor integrated circuit in which bipolar transistors and MOS transistors are formed on the same single semiconductor substrate, wherein a gate electrode of a MOS transistor and an emitter electrode or a base electrode of a bipolar transistor are formed of a polysilicon of the same conductive layer.

According to another aspect of the present invention, there is provided a process for manufacturing a semiconductor integrated circuit in which bipolar transistors and MOS transistors are formed on the same single semiconductor substrate, the process including the steps of:

forming in a semiconductor substrate a P-type region for forming a MOS transistor and an N-type region for forming a bipolar transistor;

introducing P-type impurity into the N-type region to form a base region;

forming a gate oxide film on the N-type region and the P-type region;

selectively removing the gate oxide film on the N-type region to form an opening exposing an emitter forming area or a graft base forming area;

depositing polysilicon and patterning the deposited polysilicon to form a gate electrode and an electrode which covers the opening and a region in which a base-emitter junction to be formed is exposed at the surface of the semiconductor substrate;

introducing N-type impurity into the P-type region using the gate electrode as a mask, to form a low impurity concentration N-type diffused region;

forming an insulating film covering the whole surface and etching back the insulating film so as to form a side wall insulating film on a side surface of the polysilicon electrode; and introducing N-type impurity into the P-type region using the gate electrode and the side wall insulating film as a mask, to form a high impurity concentration N-type diffused region.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the semiconductor integrated circuit in accordance with the present invention as well as embodiments of the process in accordance with the present invention for manufacturing a semiconductor integrated circuit, will be described with reference to the accompanying drawings.

FIRST EMBODIMENT

Referring to FIGS. 7 to 11, there are shown diagrammatic sectional views illustrating a first embodiment of the process in accordance with the present invention for manufacturing a "BiCMOS" semiconductor integrated circuit.

Figure 1:
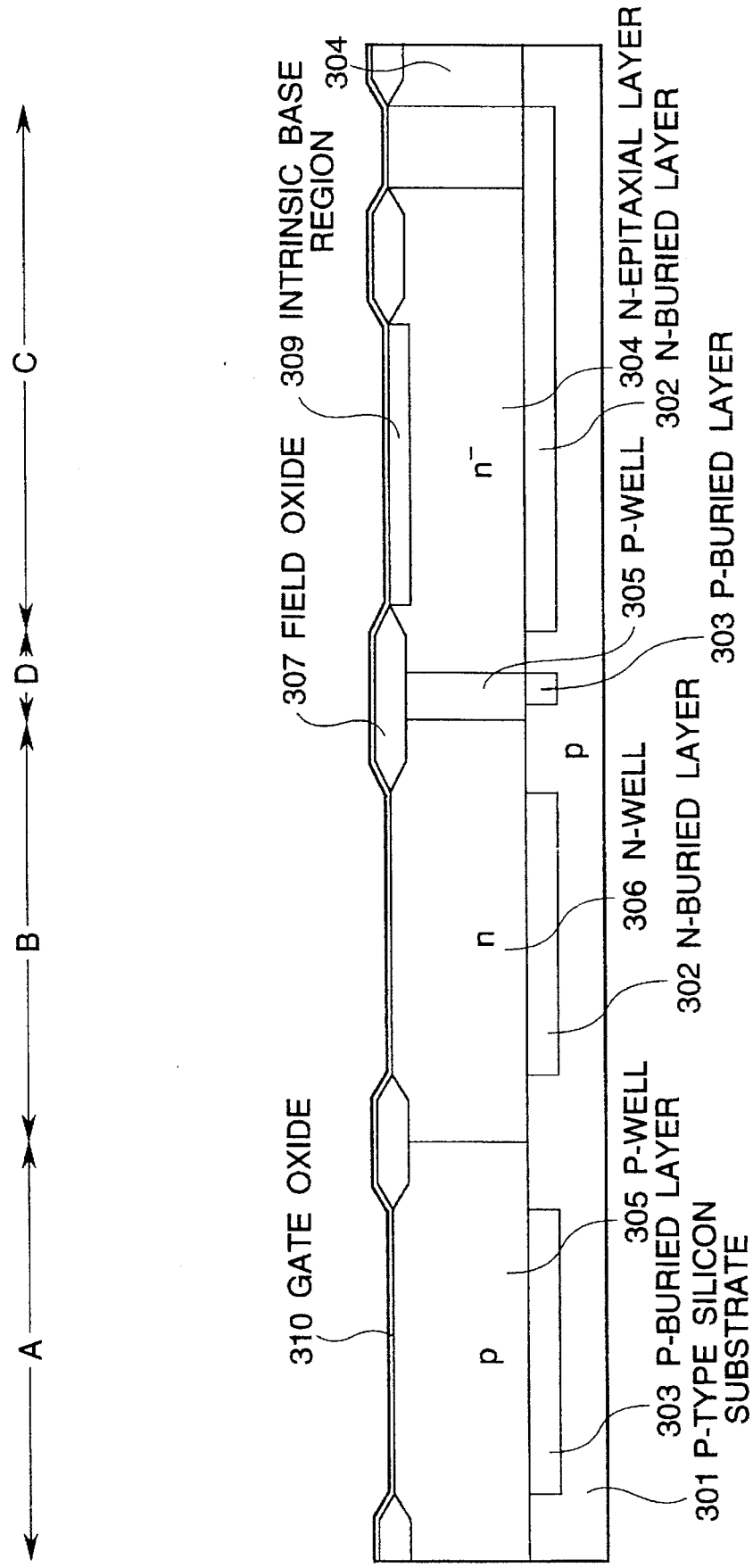
FIGS. 1 to 3 are diagrammatic sectional views illustrating a first prior art process for manufacturing a "BiCMOS" semiconductor integrated circuit.
Figure 2:
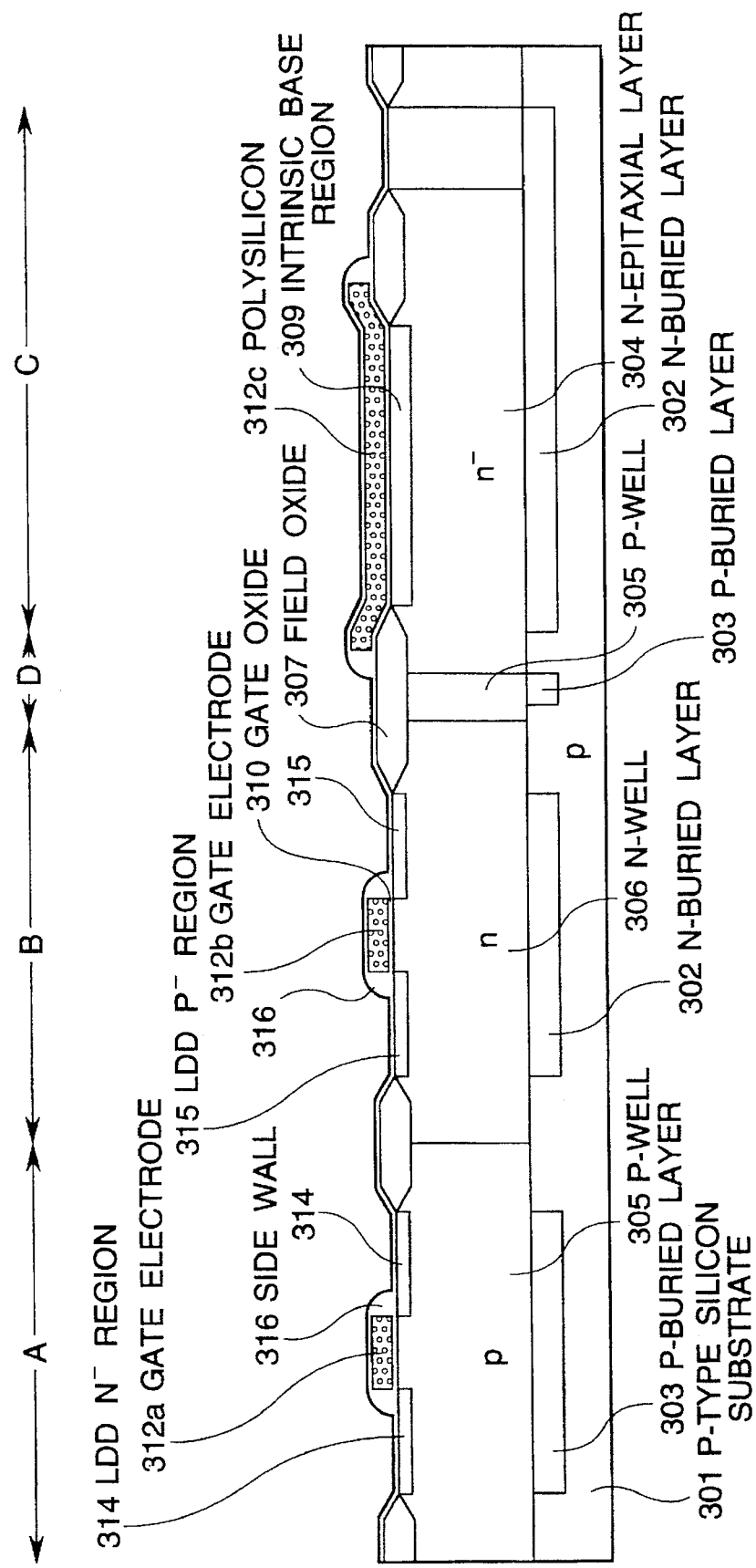
Figure 3:
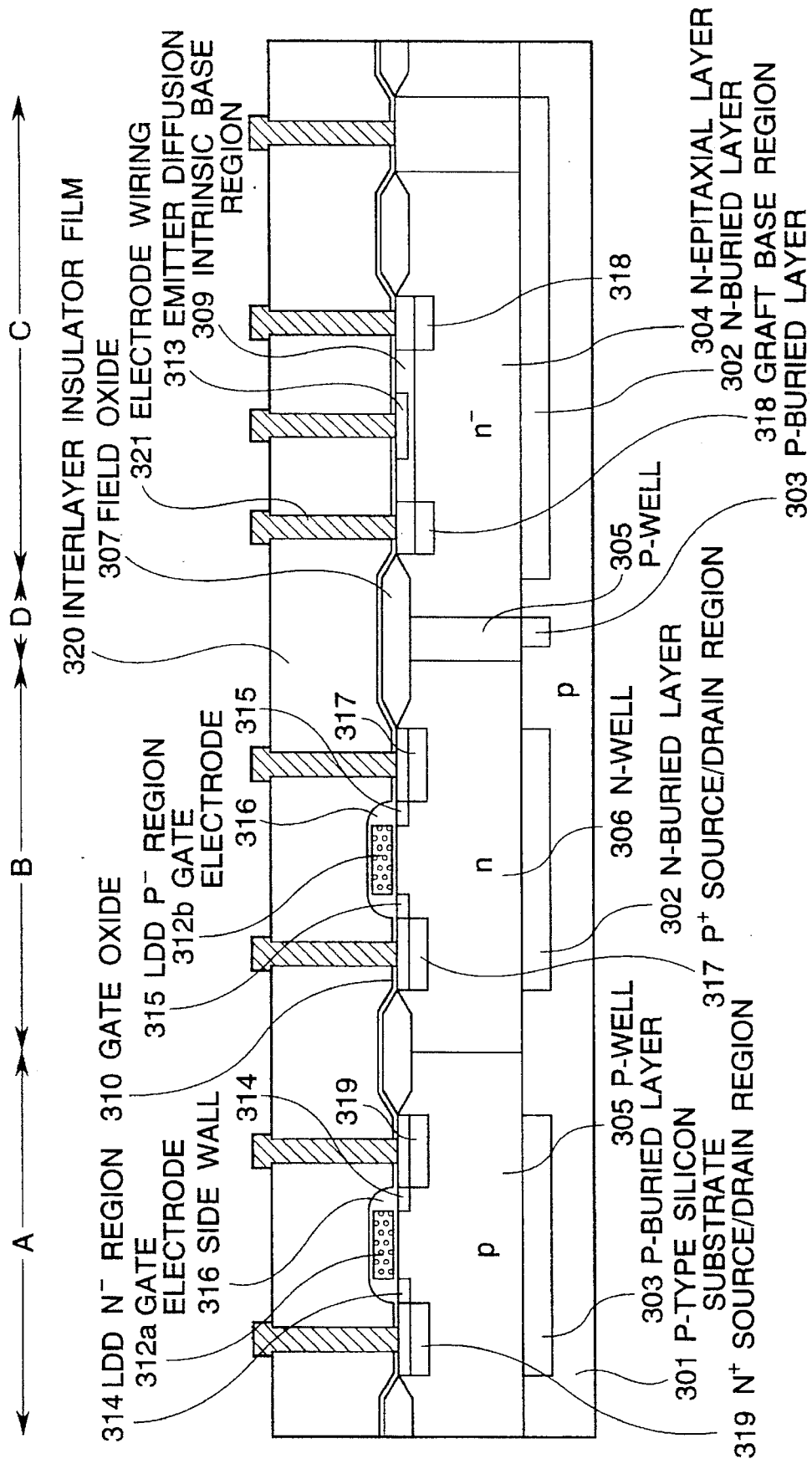
Figure 4:
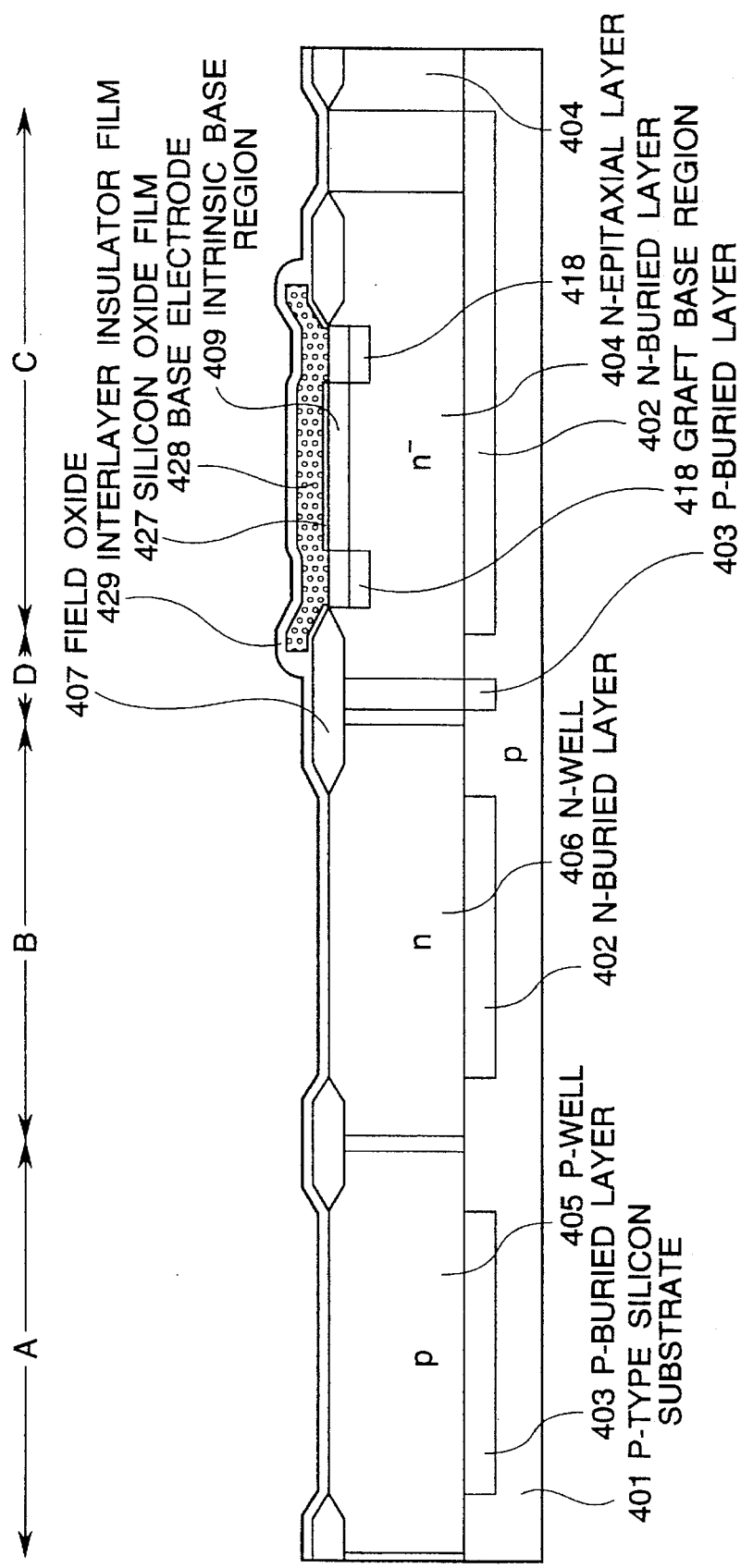
FIGS. 4 to 6 are diagrammatic sectional views illustrating a second prior art process for manufacturing a "BiCMOS" semiconductor integrated circuit.
Figure 5:
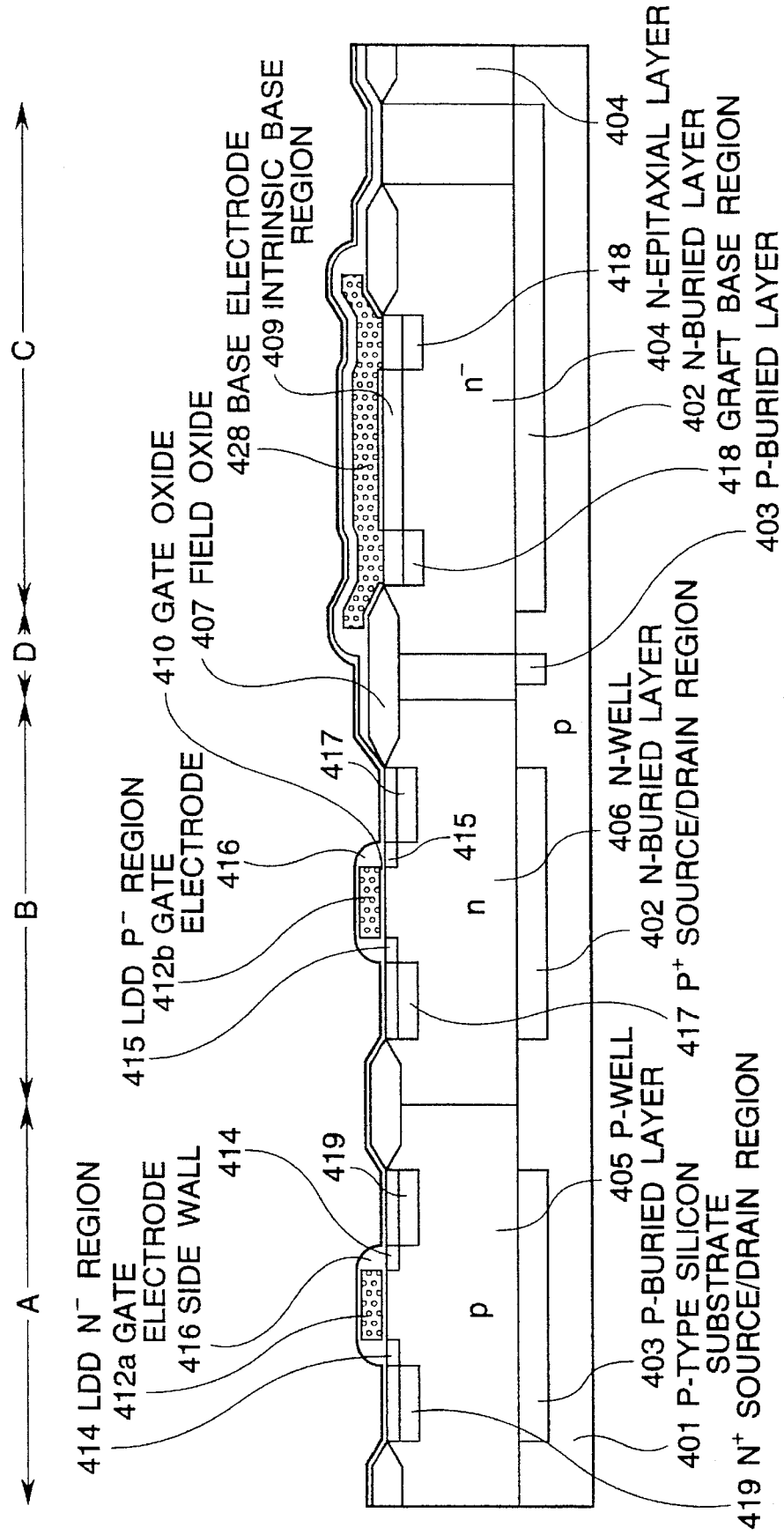
Figure 6:
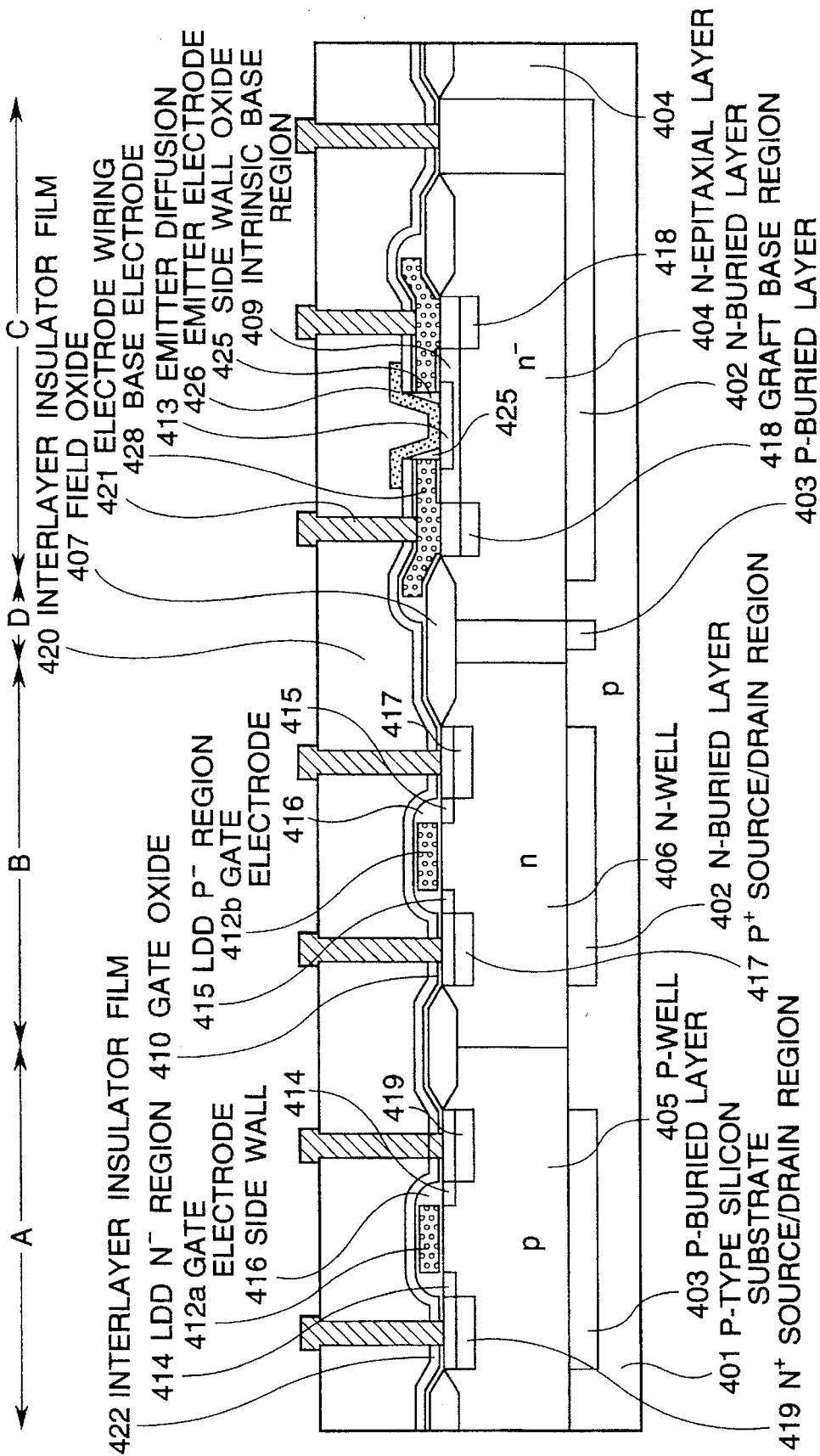
Figure 7:
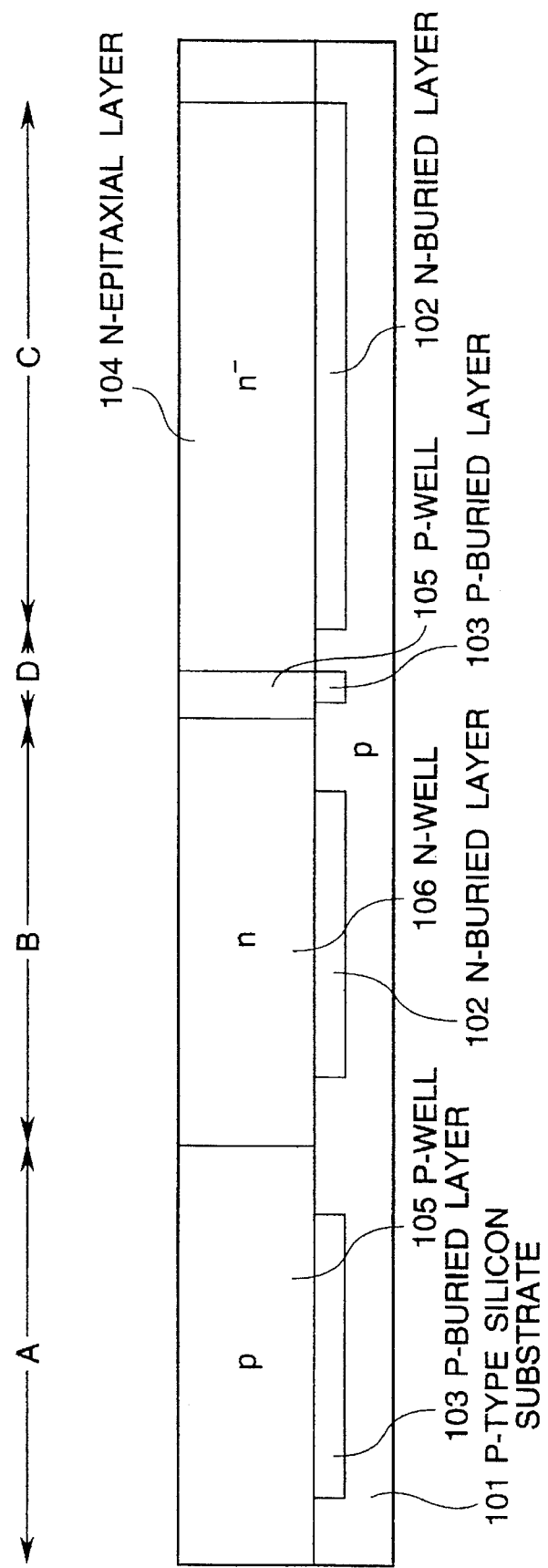
FIGS. 7 to 11 are diagrammatic sectional views illustrating a first embodiment of the process in accordance with the present invention for manufacturing a "BiCMOS" semiconductor integrated circuit.

In FIG. 7, A, B, C and D respectively designate an nMOS transistor forming area, a pMOS transistor forming area, a bipolar transistor transistor forming area, and a device isolation part forming area.

First, arsenic is ion-implanted into a P-type silicon substrate 101 in areas B and C to form an N-type buried layer 102, as shown in FIG. 7, and boron is ion-implanted into the P-type silicon substrate 101 in area A and D to form a P-type buried layer 103, as shown in FIG. 7. Then, an N-type epitaxial layer 104 is grown on the whole surface of the substrate, as shown in FIG. 7.

Furthermore, by ion-implanting boron into the N-type epitaxial layer 104 in areas A and D, a P-type well 105 is formed, as shown in FIG. 7, and by ion-implanting phosphorus into the N-type epitaxial layer 104 in area B, an N-type well 106 is formed, as shown in FIG. 7.

Figure 8:
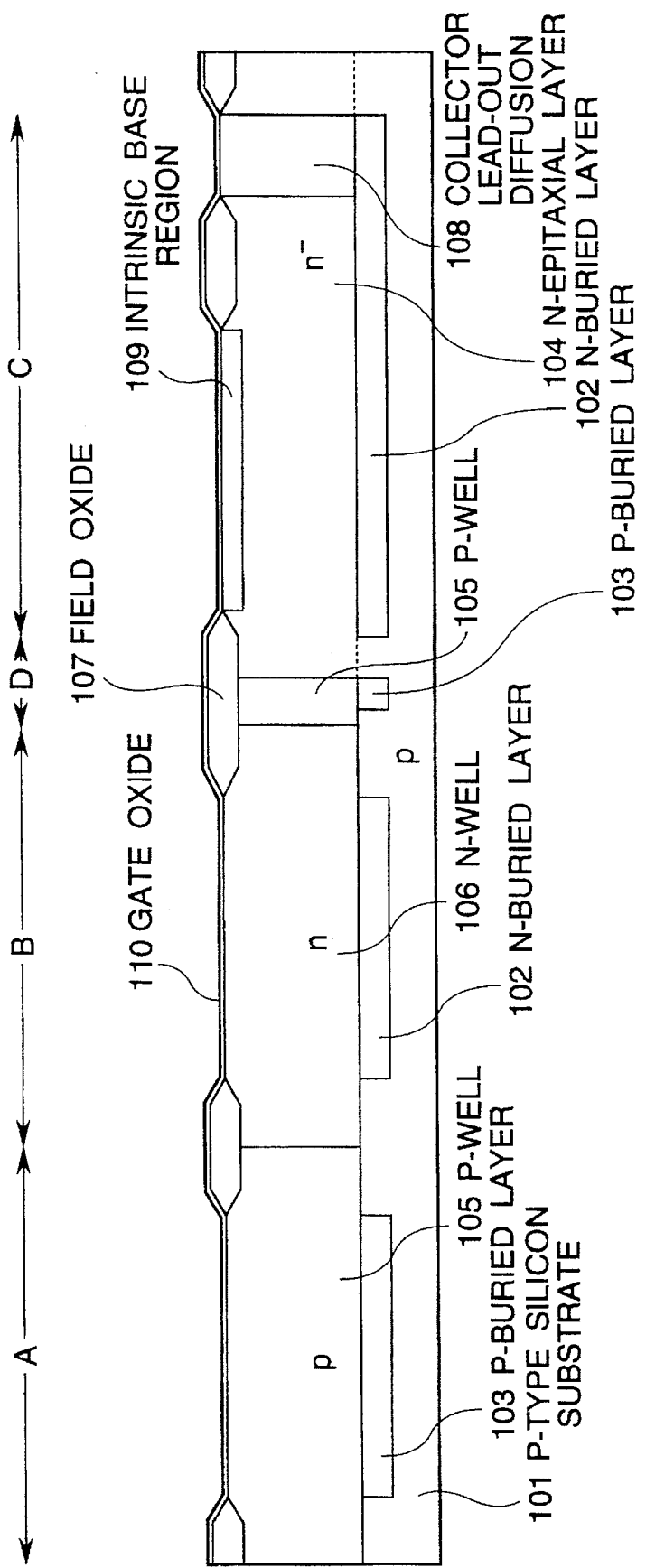

Thereafter, an oxide film and a nitride film are grown by a thermal oxidation and a CVD process, respectively, and these stacked insulator films are patterned to leave the nitride film on each of diffused layer forming areas for a MOS transistor and a bipolar transistor. Furthermore, a thermal oxidation is carried out to form a field oxide film 107 having a thickness of about 5000 Å in the device isolation part, as shown in FIG. 8. Thereafter, the nitride film is removed, and phosphorus is ion-implanted into a collector lead-out region to form a collector lead-out diffused region 108, as shown in FIG. 8. Furthermore, an ion implantation is carried out for controlling the threshold $V_T$, and boron is ion-implanted to form an intrinsic base region 109 for the bipolar transistor, and then, a gate oxide film 110 is formed, as shown in FIG. 8.

Figure 9:
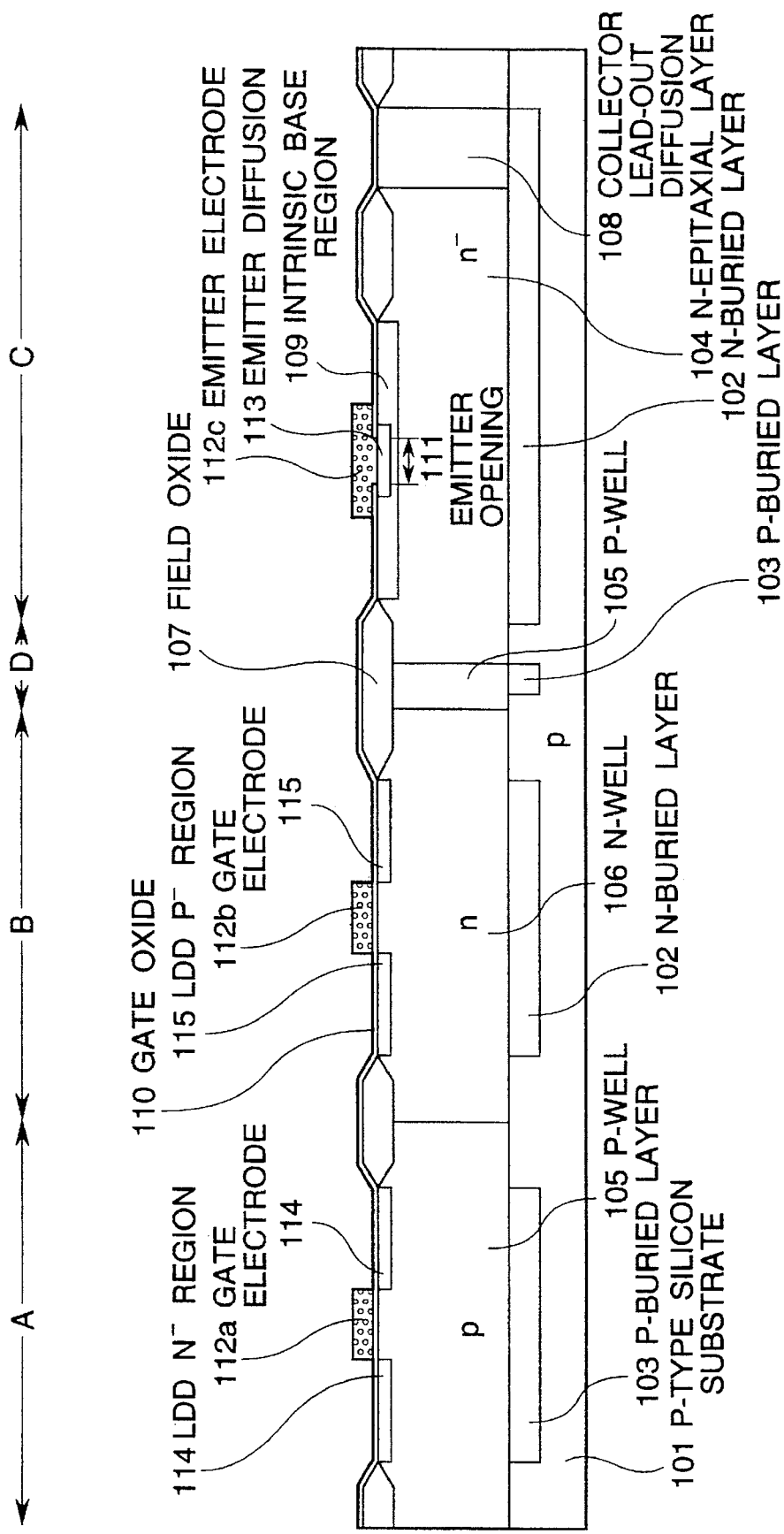

Thereafter, as shown in FIG. 9, the oxide film is selectively removed from an emitter diffused region forming area within area C, so as to form an emitter opening 111. Then, a polysilicon layer having a thickness of 1000 Å is deposited as a gate electrode material, and furthermore, is modified to have an N-type conductivity, by forming a glass layer using a POCl$_3$ as a raw material, performing a drive treatment, and then, removing the glass layer, or alternatively by ion-implanting N-type impurity such as arsenic. This polysilicon layer is patterned to form gate electrodes 112a and 112b in areas A and B. At this time, however, in area C, the polysilicon layer is left as an emitter electrode 112c above an emitter diffused region forming area for the bipolar transistor.

Then, a suitable heat treatment is performed to form an emitter diffused region 113 due to diffusion from the polysilicon layer. Furthermore, by ion-implanting phosphorus at a low concentration in area A, LDD N$^-$ regions 114 are formed, and by ion-implanting boron at a low concentration in area B, LDD P$^-$ regions 115 are formed, as shown in FIG. 9.

Figure 10:
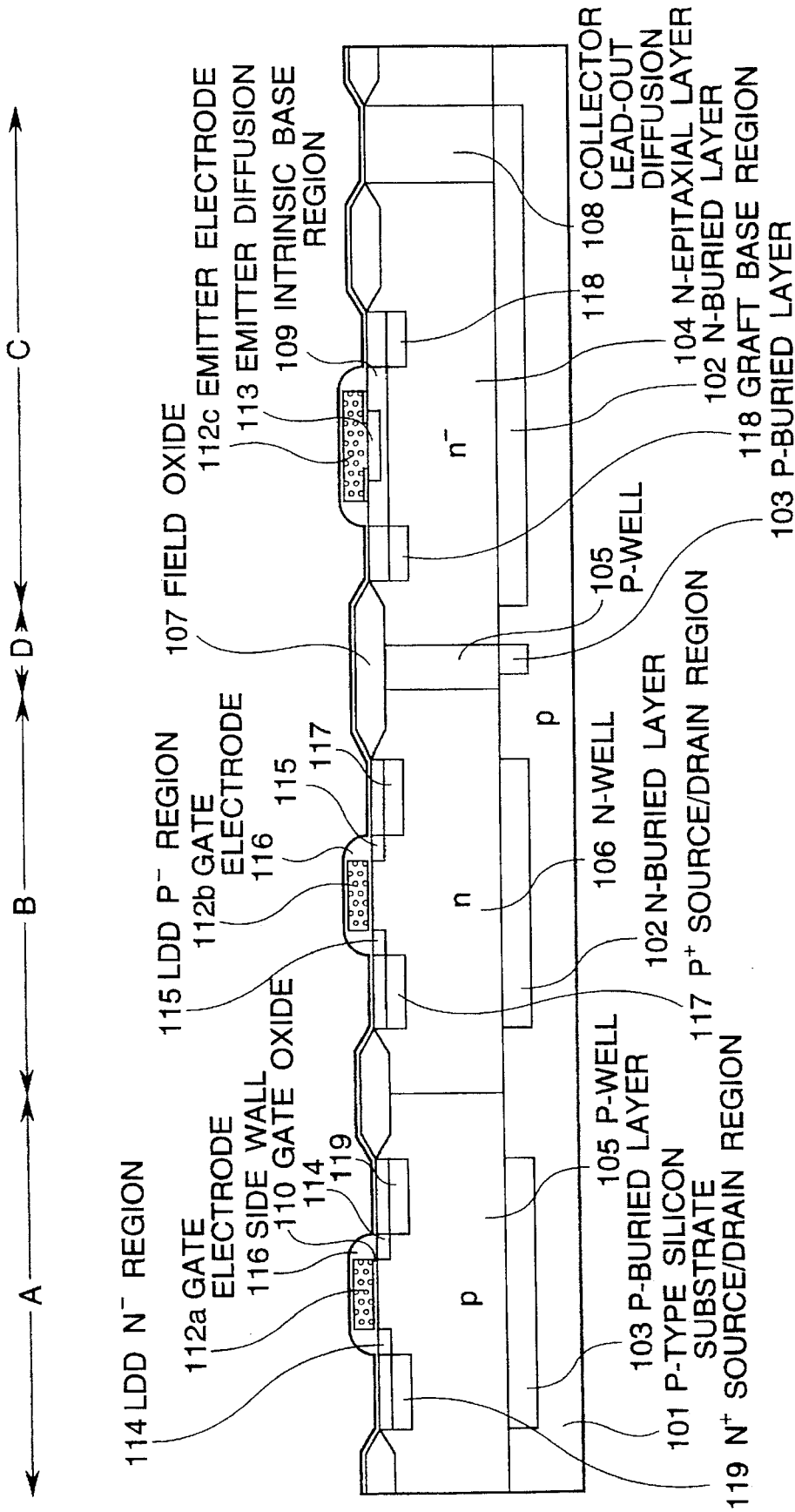

Furthermore, an oxide film having a thickness of 1000 Å to 2000 Å is grown on the whole surface, and then, an isotropic etching is carried out to form side walls 116 at each side of the gate electrodes and the emitter electrode, as shown in FIG. 10. In this process, there may be considered possibility that the gate oxide film in the base region of the bipolar transistor is removed to expose the silicon substrate 101. However, since the area in which the base-emitter junction is formed is positioned under the emitter electrode 112c, the area is protected from etching damage.

Thereafter, boron fluoride is ion-implanted into portions not covered by the gate electrodes, the emitter electrode and the side walls, within areas B and C, to form P$^+$ source/drain regions 117 and a graft base region 118. Similarly, arsenic is ion-implanted within area A so as to form N$^+$ source/drain regions 119.

Figure 11:
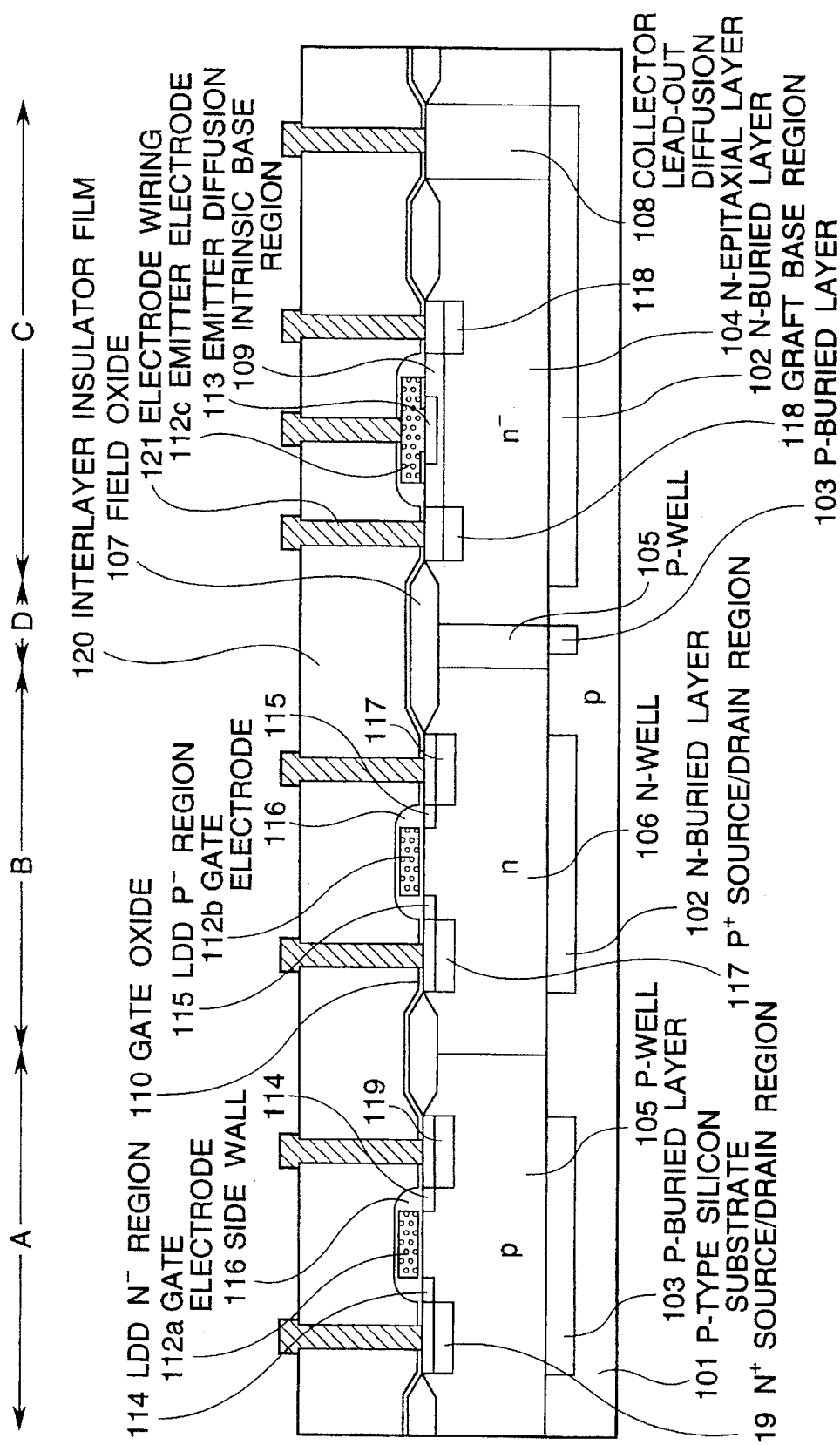

Finally, as shown in FIG. 11, an interlayer insulator film 120 is grown and planarized, and then, necessary contact holes are formed and electrode wirings 121 of for example aluminum are formed. Thus, the BiCMOS semiconductor device having the sectional structure shown in FIG. 11 is obtained.

SECOND EMBODIMENT

Now, a second embodiment of the process in accordance with the present invention for manufacturing a "BiCMOS" semiconductor integrated circuit will be described with FIGS. 12 to 16. In FIGS. 12 to 16, elements corresponding to those shown in FIGS. 7 to 11 are given the Reference Numerals having the same two least significant digits as those of Reference Numerals given to the corresponding ones shown in FIGS. 7 to 11, and explanation thereof will be omitted.

In this second embodiment, the steps of FIGS. 7 and 8 carried out in the first embodiment are carried out without modification.

Figure 12:
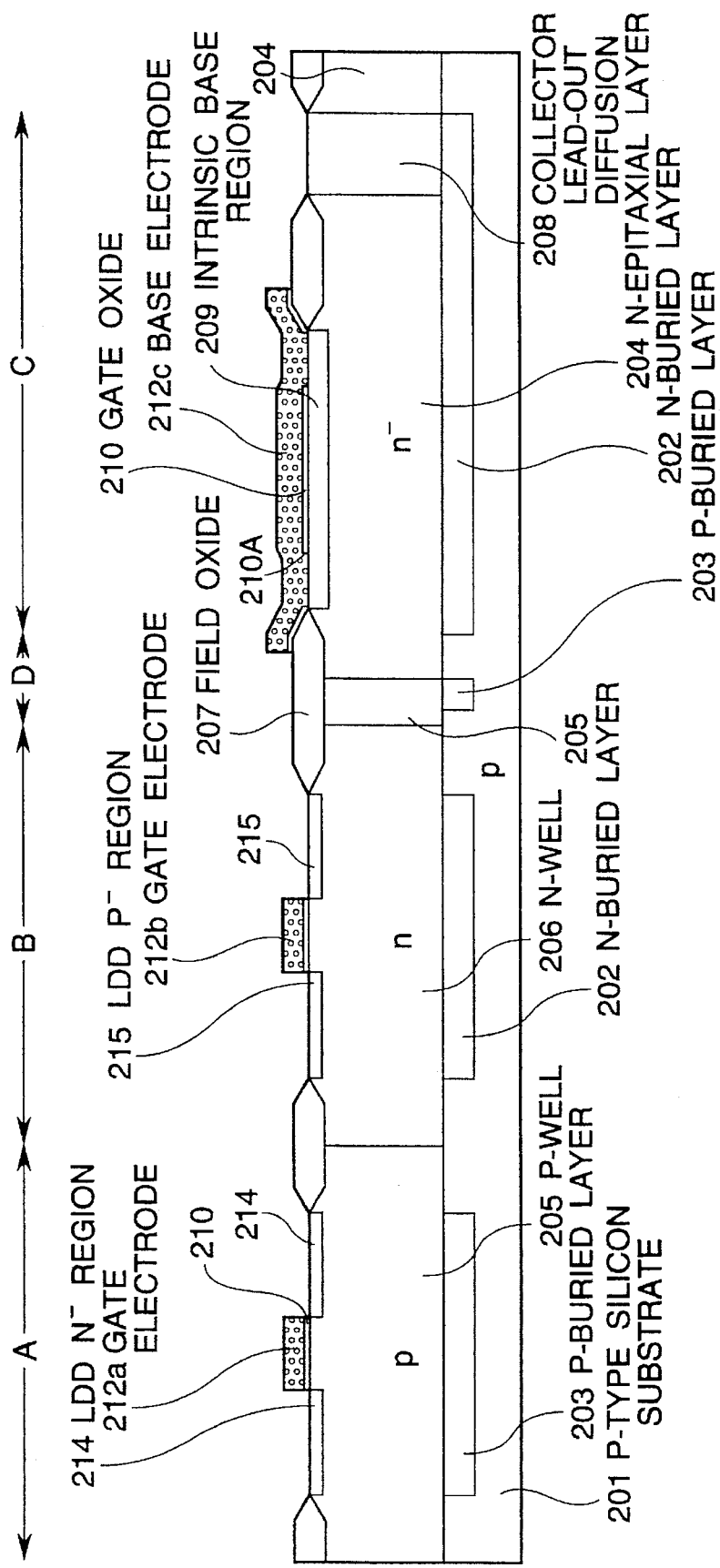
FIGS. 12 to 16 are diagrammatic sectional views illustrating a second embodiment of the process in accordance with the present invention for manufacturing a "BiCMOS" semiconductor integrated circuit.

After boron is ion-implanted to form an intrinsic base region 209 and a gate oxide film 210 is formed, the gate oxide film 210 is selectively removed by etching to form a base electrode lead-out opening 210A as shown in FIG. 12. At this time, there is left a portion of the gate oxide film 210 which covers an area in which a base-emitter junction will be formed in future.

Further, similarly to the first embodiment, a polysilicon is grown, and phosphorus is doped into the polysilicon within areas A and B to cause the doped polysilicon to have a low resistance. Then, the polysilicon is patterned to form gate electrodes 212a and 212b in areas A and B, respectively, as shown in FIG. 12. Here, the phosphorus doping to reduce the resistance of the polysilicon can be carried out within only area A.

Thereafter, similarly to the first embodiment, phosphorus is ion-implanted at a low concentration into area A, to form LDD N$^-$ regions 214, and boron is ion-implanted at a low concentration in area B, to form LDD P$^-$ regions 115, as shown in FIG. 12.

Figure 13:
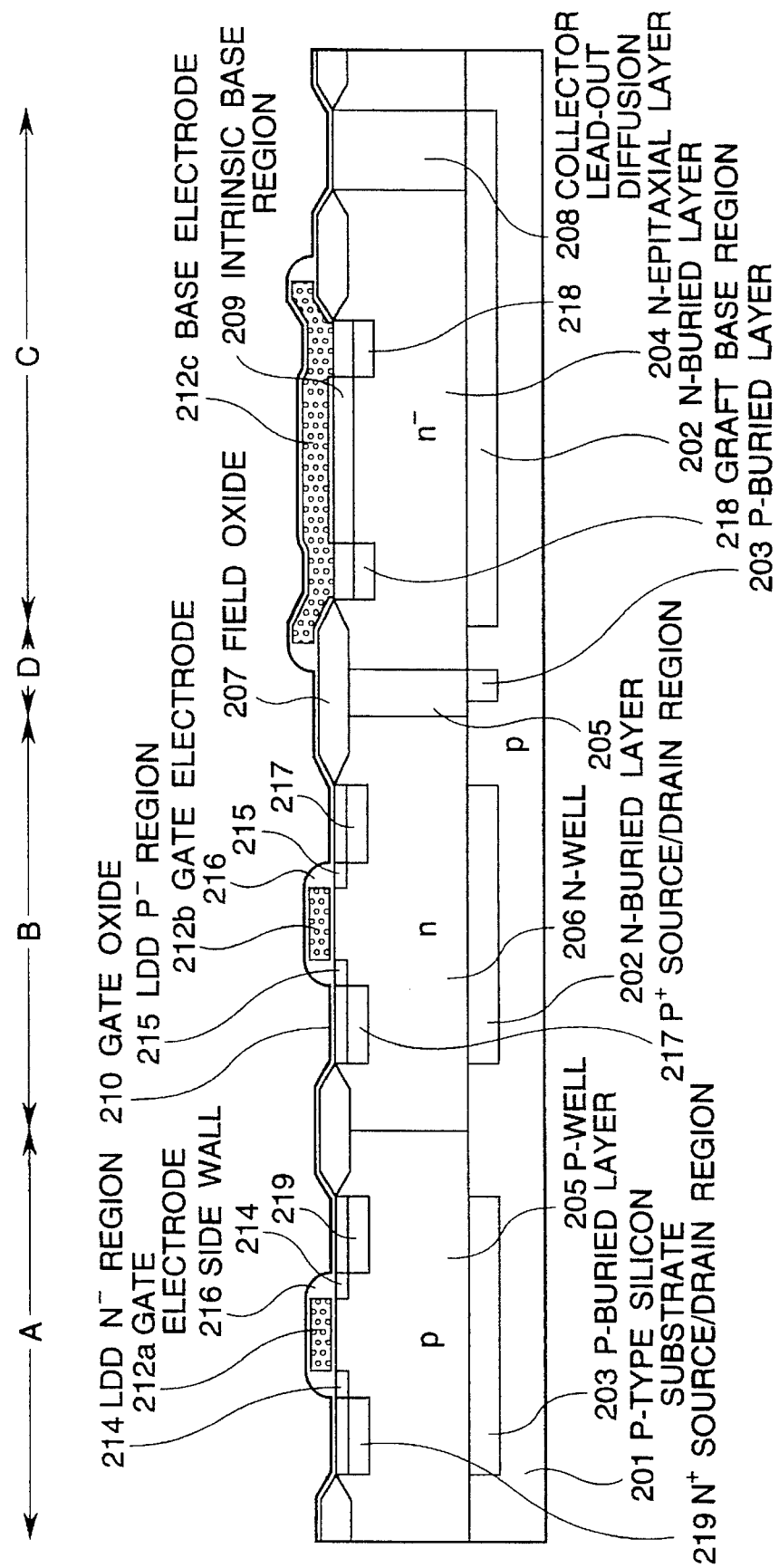

Thereafter, an oxide film for forming a side wall spacer for the MOS transistor is grown, and an anisotropic etching is performed so as to form a side wall 216 as shown in FIG. 13. At this time, since the area in which a base-emitter junction of the bipolar transistor will be formed in future, is under the polysilicon, the area is protected from etching damage.

Thereafter, boron fluoride is ion-implanted within areas B and C, to form P$^+$ source/drain regions 217 and graft base regions 218, respectively. In addition, arsenic is ion-implanted within area A, to form N$^+$ source/drain regions 219, as shown in FIG. 13.

Figure 14:
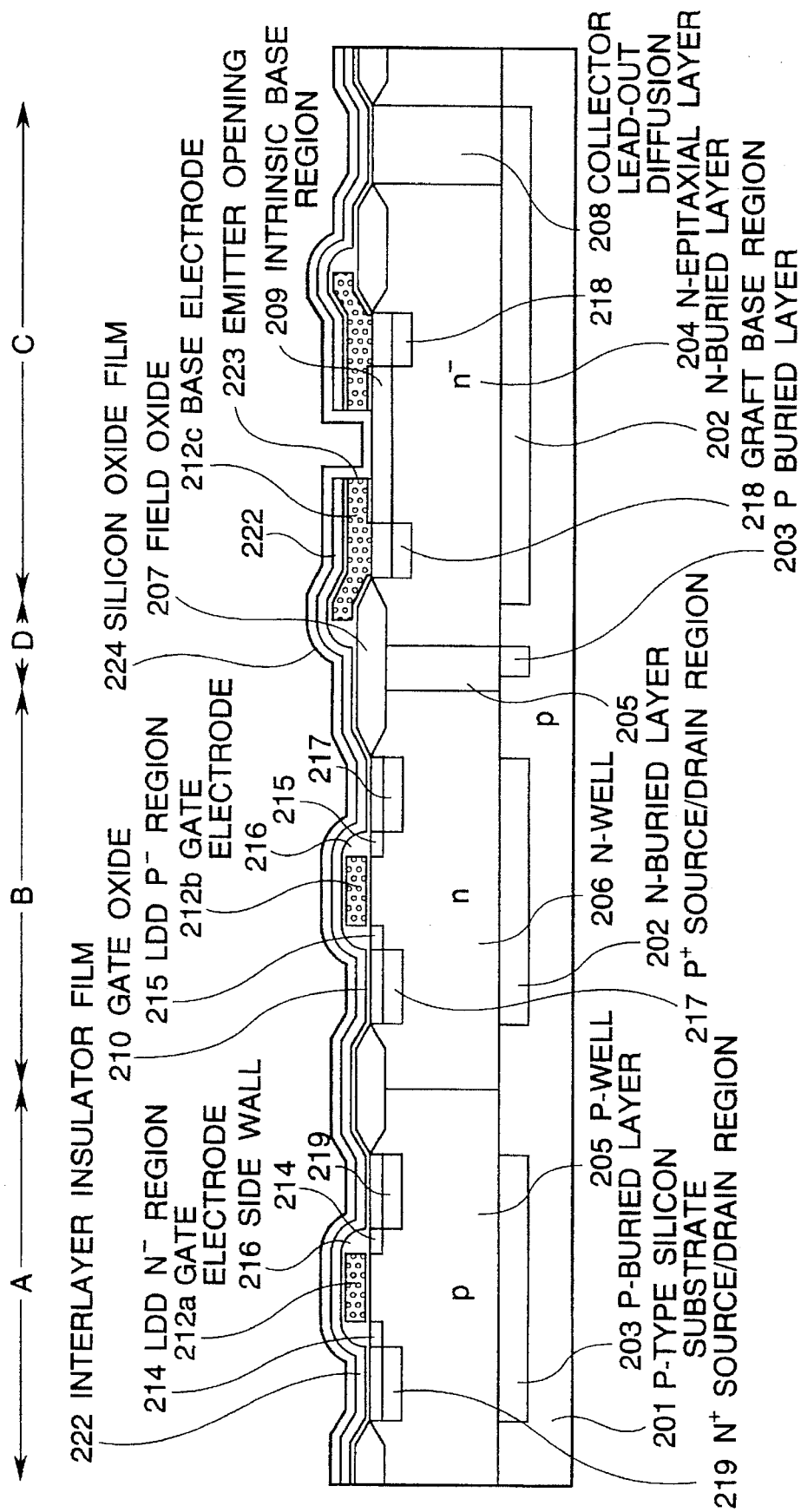

Then, as shown in FIG. 14, after an interlayer silicon oxide film 222 is grown, an emitter opening 223 for leading out an emitter electrode is formed in the gate oxide remaining within area C. At this time, an etching selection ratio is selected so as to leave the gate oxide film 210. Thereafter, the silicon oxide film 224 is deposited on the whole surface by a CVD process.

Figure 15:
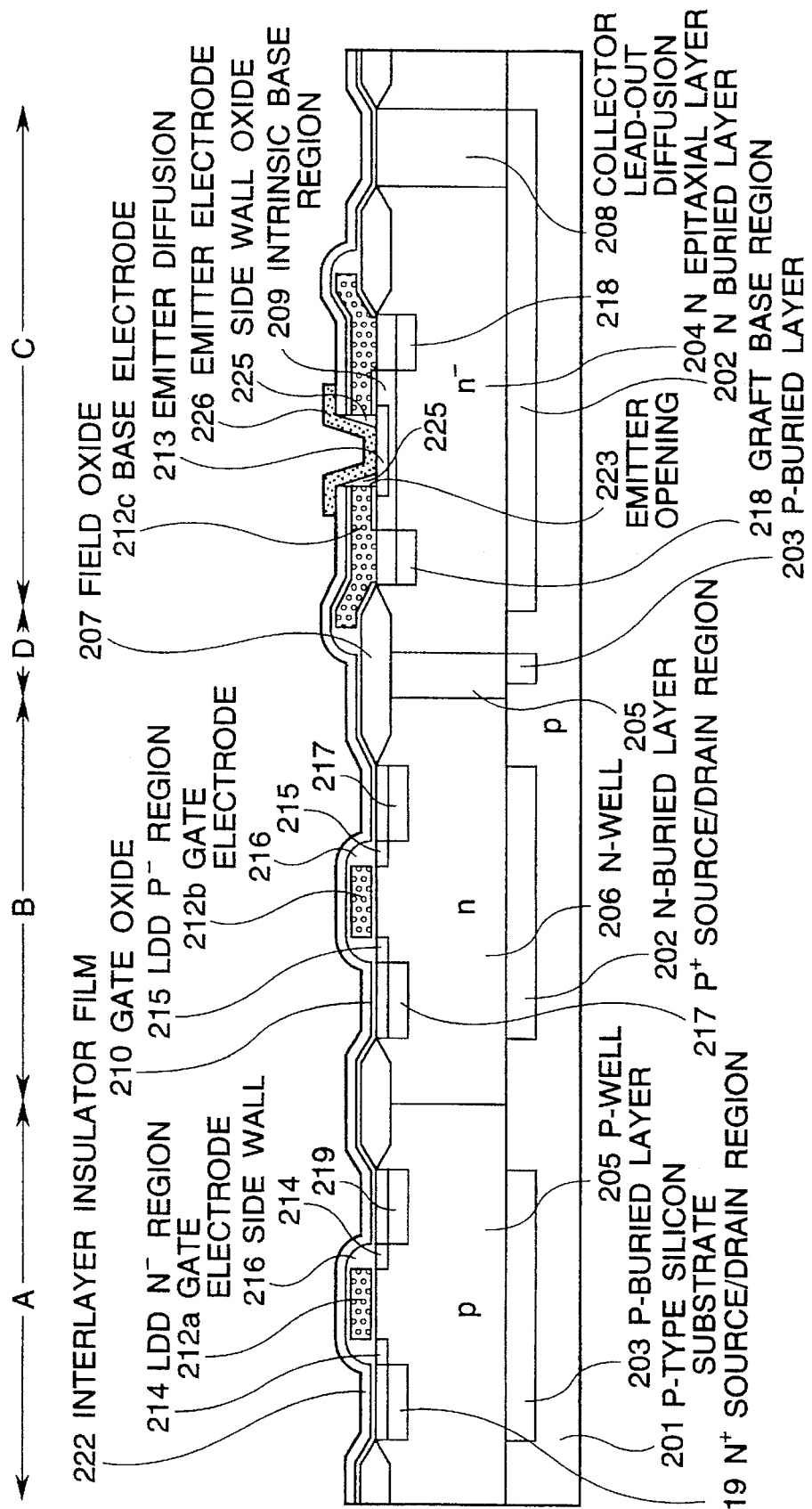

Furthermore, as shown in FIG. 15, an anisotropic etching is performed to etch back the silicon oxide film so as to form a side wall 225 at each side surface of the emitter opening 223. After the bottom of the emitter opening 223 is treated with hydrofluoric acid, a polysilicon layer is grown, and arsenic is ion-implanted. Thereafter, suitable heat treatment is performed to form an emitter diffused region 213. By photolithography, the polysilicon is patterned to form an emitter electrode 226.

Figure 16:
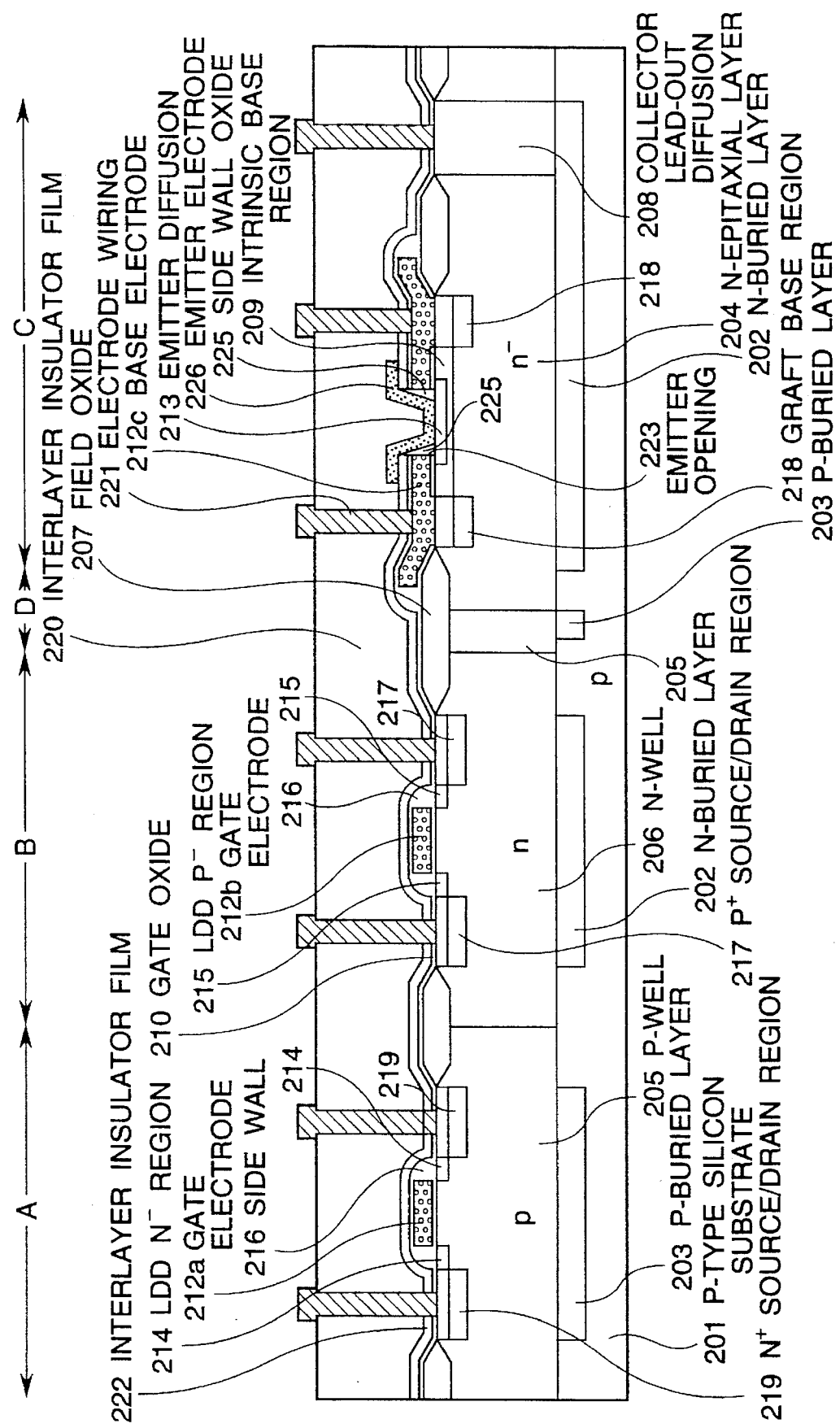

Finally, similarly to the first embodiment, an interlayer insulating film 220 is grown and a heat treatment is carried out to planarize the surface. Necessary contact holes are formed, and electrode wiring 221 formed of aluminum is deposited. Thus, the BiCMOS semiconductor device having a sectional structure shown in FIG. 16 is obtained.

MODIFICATION OF EMBODIMENTS

The invention has thus been shown and described with reference to the specific embodiments. However, it should be noted that the present invention is in no way limited to the details of the illustrated structures but changes and modifications may be made within the scope of the appended claims.

For example, in the above mentioned embodiments, the gate electrode has been formed of a single layer of polysilicon, but can be formed of a double layered structure composed of polysilicon and tungsten silicide or titanium silicide. In addition, in the above mentioned embodiments, the low impurity concentration regions for the LLD have been formed in both the nMOS transistor and the pMOS transistor, but can be formed only in the nMOS transistor. In this case, the $P^+$ source/drain regions can be formed before the step of forming the side wall.

Furthermore, the semiconductor integrated circuit in accordance with the present invention is in no way limited to only a specific application, and can be effectively applied to for example a static memory (SRAM). If the first embodiment is applied to the SRAM, the step for forming the emitter diffused region can be made in common to a step for forming a contact between a gate and an $N^+$ diffused region (direct contact) in a memory cell.

If the second embodiment is applied to the SRAM, the emitter electrode can be formed of a double layered structure of polysilicon and tungsten silicide, and can be used in common to a ground potential wiring in a memory cell.

As mentioned above, the process in accordance with the present invention for manufacturing a semiconductor integrated circuit in which bipolar transistors and MOS transistors of the LDD structure are formed on the same single semiconductor substrate, since the gate electrode can be formed in the step for forming the emitter electrode or the base electrode of the bipolar transistor, the process can be simplified. In addition, the base-emitter junction is protected from the damage occurring when the side wall is formed. Therefore, it is possible to manufacture a high performance bipolar transistor with a reduced cost.

In addition, in the first embodiment of the process in accordance with the present invention for manufacturing the semiconductor integrated circuit, since the emitter diffused region of the bipolar transistor is formed by ion-implanting through the emitter electrode of the polysilicon, the base-emitter junction can be made shallow. Therefore, it is possible to provide a high performance BiCMOS integrated circuit.

I claim:

1. A process for manufacturing a semiconductor integrated circuit in which bipolar transistors and MOS transistors are formed on the same single semiconductor substrate, the process including the steps of:

forming in a semiconductor substrate a P-type region for forming a MOS transistor and an N-type region for forming a bipolar transistor;

introducing P-type impurity into said N-type region to form a base region;

forming a gate oxide film on said N-type region and said P-type region, said introducing of said P-type impurity being performed before forming of said gate oxide film;

selectively removing said gate oxide film on said N-type region to form an opening exposing a graft base forming area;

depositing a first polysilicon and patterning the deposited first polysilicon to form a gate electrode and an electrode which covers said opening and a region in which a base-emitter junction to be formed is exposed at the surface of said semiconductor substrate;

introducing N-type impurity into said P-type region using said gate electrode as a mask, to form a low impurity concentration N-type diffused region;

forming a first insulating film covering the whole surface and etching back said first insulating film so as to form a side wall insulating film on a side surface of said electrodes of said first polysilicon;

introducing N-type impurity into said P-type region using said gate electrode and said side wall insulating film as a mask, to form a high impurity concentration N-type diffused region;

forming an aperture in said first polysilicon above said N-type region;

forming a second insulating film covering the whole surface and etching back said second insulating film so as to form a side wall insulating layer at an inside side surface of said aperture;

depositing a second polysilicon on a region including a bottom of said aperture;

introducing N-type impurity into said second polysilicon so that an emitter diffused region is formed in a surface region of said base region and therefore said base-emitter junction is formed between said emitter diffused region and said base regions; and patterning said second polysilicon to form an emitter electrode.

2. A process for manufacturing a semiconductor integrated circuit in which bipolar transistors and MOS transistors are formed on the same single semiconductor substrate, the process including the steps of:

forming in a semiconductor substrate a first N-type region for forming a MOS transistor and a second N-type region for forming a bipolar transistor;

introducing P-type impurity into said second N-type region to form a base region;

forming a gate oxide film on said first and second N-type regions;

selectively removing said gate oxide film on said second N-type region to form an opening exposing a graft base forming area;

depositing polysilicon and patterning the deposited polysilicon to form a gate electrode and a base electrode which covers said second N-type region;

forming an insulating film covering the whole surface and etching back said insulating film so as to form a side wall insulating film on a side surface of said polysilicon electrode;

before and/or after formation of said side wall insulating film, introducing P-type impurity into said first and second N-type regions, to form source/drain regions in said first N-type region and a graft base region in said second N-type region;

selectively removing said base electrode and said gate insulator film under said gate electrode, to form an emitter opening; and introducing N-type impurity through said emitter opening to form an emitter region at a surface region of said base region.

* * * * *